United States Patent
Murai

(10) Patent No.: US 11,728,447 B2
(45) Date of Patent: *Aug. 15, 2023

(54) SEMICONDUCTOR DEVICE AND IMAGING APPARATUS

(71) Applicant: SONY GROUP CORPORATION, Tokyo (JP)

(72) Inventor: Makoto Murai, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 27 days.

This patent is subject to a terminal disclaimer.

(21) Appl. No.: 17/327,316

(22) Filed: May 21, 2021

(65) Prior Publication Data

US 2021/0280724 A1    Sep. 9, 2021

Related U.S. Application Data

(63) Continuation of application No. 16/065,972, filed as application No. PCT/JP2016/085576 on Nov. 30, 2016, now Pat. No. 11,024,757.

(30) Foreign Application Priority Data

Jan. 15, 2016   (JP) .................................. 2016-006517

(51) Int. Cl.
*H01L 31/024*     (2014.01)
*H01L 27/14*      (2006.01)
(Continued)

(52) U.S. Cl.
CPC ............ *H01L 31/024* (2013.01); *H01L 25/10* (2013.01); *H01L 25/105* (2013.01); *H01L 25/11* (2013.01);
(Continued)

(58) Field of Classification Search
CPC ..... H01L 31/024; H01L 25/10; H01L 25/105; H01L 25/11; H01L 25/18; H01L 25/50;
(Continued)

(56) References Cited

U.S. PATENT DOCUMENTS 5,889,326 A *  3/1999  Tanaka .................... H01L 24/81
                                                       257/E21.511
6,320,254 B1 * 11/2001  Liou ................. H01L 23/49816
                                                       257/772
(Continued)

FOREIGN PATENT DOCUMENTS

CN      103943613 A     7/2014
JP      2001-274324 A  10/2001
(Continued)

OTHER PUBLICATIONS

Office Action for CN Patent Application No. 2017-561538 dated Apr. 6, 2021, 05 pages of Office Action and 04 pages of English Translation.

(Continued)

*Primary Examiner* — Mohammed Shamsuzzaman
(74) *Attorney, Agent, or Firm* — Chip Law Group

(57) ABSTRACT

In a semiconductor device, a first package is provided with a first substrate under which a semiconductor chip configured to output a signal and a first wiring electrically connected to the semiconductor chip are arranged. A second package is provided with a second substrate above which a processing circuit configured to process the output signal, a second wiring electrically connected to the processing circuit, and an encapsulant configured to seal the processing circuit are arranged, the semiconductor chip and the encapsulant being arranged to face each other in a non-contact manner. A connection portion electrically connects the first wiring and the second wiring.

9 Claims, 9 Drawing Sheets

(51) Int. Cl.
*H01L 25/10* (2006.01)
*H01L 25/11* (2006.01)
*H01L 25/18* (2023.01)
*H01L 25/00* (2006.01)
*H01L 31/0224* (2006.01)
*H01L 31/0203* (2014.01)
*H01L 27/146* (2006.01)
*H04N 23/54* (2023.01)
*H04N 23/55* (2023.01)

(52) U.S. Cl.
CPC .............. *H01L 25/18* (2013.01); *H01L 25/50* (2013.01); *H01L 27/14* (2013.01); *H01L 27/1469* (2013.01); *H01L 27/14618* (2013.01); *H01L 27/14625* (2013.01); *H01L 27/14627* (2013.01); *H01L 27/14634* (2013.01); *H01L 27/14636* (2013.01); *H01L 31/0203* (2013.01); *H01L 31/0224* (2013.01); *H04N 23/54* (2023.01); *H04N 23/55* (2023.01); *H01L 2224/16225* (2013.01); *H01L 2225/1017* (2013.01); *H01L 2225/1058* (2013.01); *H01L 2225/1094* (2013.01)

(58) Field of Classification Search
CPC .............. H01L 27/14; H01L 27/14618; H01L 27/14625; H01L 27/14627; H01L 27/14634; H01L 27/14636; H01L 27/1469; H01L 31/0203; H01L 31/0224; H01L 2224/16225; H01L 2225/1017; H01L 2225/1058; H01L 2225/1094; H01L 2224/32225; H01L 2224/73204; H01L 2924/15153; H01L 2924/15192; H01L 2924/15311; H01L 2924/15321; H01L 2924/15331; H01L 2924/18161; H04N 23/54; H04N 23/55
See application file for complete search history.

(56) References Cited

U.S. PATENT DOCUMENTS

| | | | |
|---|---|---|---|
| 6,424,036 B1* | 7/2002 | Okada | H01L 21/76841 257/734 |
| 7,795,743 B2* | 9/2010 | Kim | H01L 23/562 257/772 |
| 7,960,270 B2* | 6/2011 | Lee | H01L 25/50 438/612 |
| 8,349,721 B2* | 1/2013 | Shim | H01L 23/49811 257/E23.021 |
| 8,503,186 B2* | 8/2013 | Lin | H01L 24/82 361/764 |
| 9,252,094 B2* | 2/2016 | Choi | H01L 23/49816 |
| 9,299,674 B2* | 3/2016 | Yu | H01L 24/13 |
| 9,425,136 B2 | 8/2016 | Kuo et al. | |
| 9,478,474 B2* | 10/2016 | Chen | H01L 23/3128 |
| 9,570,322 B2* | 2/2017 | Su | H01L 24/97 |
| 9,646,923 B2* | 5/2017 | Tseng | H01L 23/5283 |
| 9,754,892 B2* | 9/2017 | Kwon | H01L 24/24 |
| 9,793,242 B2* | 10/2017 | Liu | H01L 25/0657 |
| 9,859,202 B2* | 1/2018 | Hu | H01L 21/486 |
| 10,163,872 B2* | 12/2018 | Yu | H01L 21/4853 |
| 10,170,429 B2* | 1/2019 | Huang | H01L 21/486 |
| 2002/0000327 A1 | 1/2002 | Juso et al. | |
| 2002/0129894 A1* | 9/2002 | Liu | H01L 24/81 156/291 |
| 2004/0124527 A1* | 7/2004 | Chiu | H01L 23/5387 257/E23.177 |
| 2005/0017336 A1* | 1/2005 | Kung | H01L 25/0657 257/E21.503 |
| 2005/0046039 A1* | 3/2005 | Yang | H01L 23/24 257/E25.023 |
| 2005/0099532 A1* | 5/2005 | Tseng | H01L 27/14618 257/E31.127 |
| 2006/0022290 A1* | 2/2006 | Chen | H01L 27/14618 257/434 |
| 2006/0220230 A1* | 10/2006 | Tanaka | H01L 24/97 257/E21.511 |
| 2007/0052083 A1* | 3/2007 | Kobayashi | H01L 23/3107 438/109 |
| 2007/0205480 A1* | 9/2007 | Kobayashi | H01L 21/563 257/466 |
| 2008/0006947 A1* | 1/2008 | Akiba | H01L 25/18 257/E23.142 |
| 2008/0169546 A1* | 7/2008 | Kwon | H01L 24/96 438/109 |
| 2008/0211079 A1* | 9/2008 | Onodera | H01L 23/36 257/E23.101 |
| 2008/0277765 A1* | 11/2008 | Lane | H01L 21/78 257/E21.546 |
| 2008/0314456 A1* | 12/2008 | Ishii | H05K 1/0272 137/271 |
| 2009/0200651 A1* | 8/2009 | Kung | H01L 25/0657 257/685 |
| 2009/0294945 A1* | 12/2009 | Okada | H01L 24/16 257/737 |
| 2010/0140796 A1* | 6/2010 | Ishido | H01L 23/49811 257/737 |
| 2010/0236817 A1* | 9/2010 | Chen | H01L 21/4857 257/E21.705 |
| 2011/0089563 A1* | 4/2011 | Kikuchi | H01L 23/3128 257/E23.021 |
| 2011/0147933 A1* | 6/2011 | Wu | H01L 25/105 438/758 |
| 2012/0018871 A1* | 1/2012 | Lee | H01L 25/0655 257/E23.194 |
| 2012/0168917 A1* | 7/2012 | Yim | H01L 23/49816 257/774 |
| 2012/0211885 A1* | 8/2012 | Choi | H01L 25/105 257/737 |
| 2012/0228746 A1* | 9/2012 | Nagata | H01L 27/14618 257/621 |
| 2012/0235969 A1* | 9/2012 | Burns | B81C 1/00095 361/748 |
| 2012/0248439 A1* | 10/2012 | Lee | H01L 23/49838 257/777 |
| 2013/0001797 A1* | 1/2013 | Choi | H01L 25/105 257/774 |
| 2013/0119562 A1* | 5/2013 | Shimizu | H01L 23/48 257/782 |
| 2013/0168871 A1* | 7/2013 | Kim | H01L 25/105 257/774 |
| 2013/0175702 A1* | 7/2013 | Choi | H01L 25/0657 257/774 |
| 2013/0221469 A1* | 8/2013 | Kim | H01L 27/14632 257/738 |
| 2014/0070353 A1* | 3/2014 | Kim | H01L 31/18 257/459 |
| 2014/0197506 A1 | 7/2014 | Watanabe | |
| 2014/0319701 A1* | 10/2014 | Kim | G11C 5/025 257/777 |
| 2014/0361430 A1* | 12/2014 | Ono | H01L 24/11 257/737 |
| 2014/0374902 A1* | 12/2014 | Lee | H01L 23/5389 257/738 |
| 2015/0091179 A1* | 4/2015 | Shenoy | H10B 12/00 438/109 |
| 2015/0115464 A1* | 4/2015 | Yu | H01L 24/32 438/109 |
| 2015/0115470 A1* | 4/2015 | Su | H01L 23/50 257/774 |
| 2015/0130078 A1* | 5/2015 | Hong | H01L 23/367 257/774 |
| 2015/0137387 A1* | 5/2015 | Choi | H01L 25/0657 257/774 |
| 2015/0279759 A1* | 10/2015 | Miyakoshi | H01L 24/73 257/738 |

(56) References Cited

U.S. PATENT DOCUMENTS

| | | | | |
|---|---|---|---|---|
| 2015/0279820 | A1* | 10/2015 | Usami | H01L 24/97 257/737 |
| 2015/0287697 | A1* | 10/2015 | Tsai | H01L 24/97 257/773 |
| 2016/0013138 | A1* | 1/2016 | Chen | H01L 23/585 257/774 |
| 2016/0027715 | A1* | 1/2016 | Watanabe | H05K 1/0209 361/719 |
| 2016/0035705 | A1* | 2/2016 | Watanabe | H01L 24/81 438/109 |
| 2016/0064358 | A1* | 3/2016 | Usami | H01L 24/32 257/737 |
| 2016/0079207 | A1* | 3/2016 | Yamaguchi | H01L 24/17 257/738 |
| 2016/0172060 | A1* | 6/2016 | Kim | G11C 29/56012 365/191 |
| 2017/0025384 | A1* | 1/2017 | Park | H01L 23/481 |
| 2017/0062322 | A1* | 3/2017 | Sakata | H01L 24/49 |
| 2017/0073219 | A1* | 3/2017 | Takagi | B81B 7/0051 |
| 2017/0141043 | A1* | 5/2017 | Park | H01L 24/20 |
| 2017/0363469 | A1* | 12/2017 | Sabry | G01J 3/0229 |
| 2017/0373693 | A1* | 12/2017 | Kondo | H03B 5/1203 |
| 2018/0102470 | A1* | 4/2018 | Das | H01L 23/5384 |
| 2018/0130846 | A1* | 5/2018 | Hasegawa | H01L 27/14618 |
| 2018/0211943 | A1* | 7/2018 | Song | H01L 23/13 |
| 2018/0308890 | A1* | 10/2018 | Wang | H01L 27/14636 |
| 2019/0013419 | A1* | 1/2019 | Murai | H01L 25/18 |
| 2019/0043910 | A1* | 2/2019 | Miyazawa | H01L 25/065 |

FOREIGN PATENT DOCUMENTS

| | | |
|---|---|---|
| JP | 2002-016182 A | 1/2002 |
| JP | 2004-356138 A | 12/2004 |
| JP | 2005-079408 A | 3/2005 |
| JP | 2009-070882 A | 4/2009 |
| JP | 2010-245506 A | 10/2010 |
| JP | 2014-138119 A | 7/2014 |
| KR | 10-2002-0001536 A | 1/2002 |
| TW | 516194 B | 1/2003 |
| TW | 201513297 A | 4/2015 |
| WO | 2014/175133 A1 | 10/2014 |

OTHER PUBLICATIONS

Office Action for JP Patent Application No. 2017-561538 dated Jan. 5, 2021, 04 pages of Office Action and 04 pages of English Translation.

International Search Report and Written Opinion of PCT Application No. PCT/JP2016/085576, dated Feb. 14, 2017, 09 pages of English Translation and 08 pages of ISRWO.

Non-Final Office Action for U.S. Appl. No. 16/065,972, dated May 22, 2019, 09 pages.

Non-Final Office Action for U.S. Appl. No. 16/065,972, dated May 5, 2020, 09 pages.

Final Office Action for U.S. Appl. No. 16/065,972, dated Sep. 27, 2019, 09 pages.

Final Office Action for U.S. Appl. No. 16/065,972, dated Oct. 8, 2020, 12 pages.

Advisory Action for U.S. Appl. No. 16/065,972, dated Dec. 5, 2019, 03 pages.

Advisory Action for U.S. Appl. No. 16/065,972, dated Dec. 15, 2020, 03 pages.

Notice of Allowance for U.S. Appl. No. 16/065,972, dated Apr. 29, 2021, 02 pages.

Notice of Allowance for U.S. Appl. No. 16/065,972, dated Apr. 14, 2021, 02 pages.

Notice of Allowance for U.S. Appl. No. 16/065,972, dated Feb. 3, 2021, 14 pages.

International Preliminary Report on Patentability of PCT Application No. PCT/JP2016/085576, dated Jul. 26, 2018, 09 pages of English Translation and 05 pages of IPRP.

\* cited by examiner

SEMICONDUCTOR DEVICE AND IMAGING APPARATUS

CROSS REFERENCE TO RELATED APPLICATIONS

The present application is a continuation application of U.S. patent application Ser. No. 16/065,972, filed Jun. 25, 2018, which is a U.S. National Phase of International Patent Application No. PCT/JP2016/085576 filed Nov. 30, 2016, which claims priority benefit of Japanese Patent Application No. JP 2016-006517 filed in the Japan Patent Office on Jan. 15, 2016. Each of the above-referenced applications is hereby incorporated herein by reference in its entirety.

TECHNICAL FIELD

The present technology relates to semiconductor devices and imaging apparatuses, and more specifically, relates to a semiconductor device having a semiconductor chip mounted thereon and an imaging apparatus.

BACKGROUND ART

In related art, a semiconductor device having plurality of semiconductor chips bonded together and arranged on top of each other to achieve miniaturization has been used. Specifically, in an imaging apparatus, an image sensor chip in which pixels having a photoelectric conversion device are arranged in a two-dimensional lattice pattern and an image processing chip for processing an image signal output from the image sensor chip, which are individually manufactured on the basis of their respective manufacturing processes. Then, they are bonded together and arranged on top of each other, and so the resultant miniaturized imaging apparatus is used. In an example, there has been developed a system in which these semiconductor chips are bonded together using an adhesive and arranged on top of each other (e.g., refer to Patent Literature 1).

CITATION LIST

Patent Literature

Patent Literature 1:
JP 2010-245506A

DISCLOSURE OF INVENTION

Technical Problem

In the existing technique described above, the semiconductor chips are bonded together and thermally coupled to each other, so they are disadvantageously susceptible to the influence of thermal conduction to the semiconductor chip. In other words, the heat generated in a semiconductor chip having a large heating value increases the temperature of another semiconductor chip, resulting in deterioration in the performance disadvantageously. In the imaging apparatus described above, the image processing chip operates at high speed and has relatively high degree of integration, thereby generating a large amount of heat. On the other hand, an image sensor chip having a photoelectric conversion device has a property that thermal noise increases with an increase in temperature. As described above, in the imaging apparatus described above, these semiconductor chips are bonded together, the temperature of the image sensor chip rises due to thermal conduction from the image processing chip, so the thermal noise increases and the signal-to-noise ratio (S/N ratio) decreases.

The present technology is developed in view of such circumstances and is intended to reduce the size of a semiconductor device having a semiconductor chip mounted thereon while reducing the influence of thermal conduction to the semiconductor chip in the semiconductor device.

Solution to Problem

The present technology has been made to solve the above problem. According to a first aspect of the present technology, a semiconductor device includes: a first package provided with a first substrate under which a semiconductor chip configured to output a signal and a first wiring electrically connected to the semiconductor chip are arranged; a second package provided with a second substrate above which a processing circuit configured to process the output signal, a second wiring electrically connected to the processing circuit, and an encapsulant configured to seal the processing circuit are arranged, the semiconductor chip and the encapsulant being arranged to face each other in a non-contact manner; and a connection portion configured to electrically connect the first wiring and the second wiring. This produces an effect that the semiconductor chip and the encapsulant are arranged to face each other in a non-contact manner. The thermal conduction between the processing circuit and the semiconductor chip is envisaged to be prevented.

In addition, according to the first aspect, the connection portion may include solder. This produces an effect that the first wiring and the second wiring are connected by solder.

In addition, according to the first aspect, the connection portion may be provided with a spacer used to define a space between the first substrate and the second substrate. This produces an effect that the space between the first substrate and the second substrate is defined.

In addition, according to the first aspect, the semiconductor device may further include a second connection portion electrically connected to the second wiring, the second connection portion including second solder soldered at a temperature different from that of the solder. This produces an effect that the connection portion and the second connection portion include their corresponding solder having different soldering temperatures.

In addition, according to the first aspect, the second package may be provided with the second substrate above which a conductive member is further arranged in an opening formed in the encapsulant, the conductive member being electrically connected to the second wiring, and the connection portion may electrically connect the first wiring and the second wiring through the conductive member. This produces an effect that the first wiring and the second wiring are connected through the conductive member arranged in the opening of the encapsulant.

In addition, according to a second aspect of the present technology, an imaging apparatus include: a first package provided with a first substrate under which an image sensor configured to output a signal corresponding to irradiating light and a first wiring electrically connected to the image sensor are arranged; a second package provided with a second substrate above which a processing circuit configured to process the output signal, a second wiring electrically connected to the processing circuit, and an encapsulant configured to seal the processing circuit are arranged, the image sensor and the encapsulant being arranged to face each other in a non-contact manner; and a connection portion configured to electrically connect the first wiring and the second wiring. This produces an effect that the image sensor and the encapsulant are arranged to face each other in a non-contact manner.

In addition, according to the second aspect, the first package may be provided with the first substrate including glass. This produces an effect that the first substrate includes glass.

In addition, according to the second aspect, the first package may be provided with the first substrate under which the image sensor is arranged, the image sensor outputting the signal corresponding to the irradiating light transmitting through the first substrate. This produces an effect that the image sensor is irradiated with light through the first substrate.

In addition, according to the second aspect, the imaging apparatus may further include a lens module configured to form an optical image on the image sensor through the first substrate. This produces an effect that the lens module is arranged on the image sensor.

Advantageous Effects of Invention

According to the present technology, in the semiconductor device having the semiconductor chip mounted thereon, it is possible to achieve an advantageous effect of reducing the size of the semiconductor device while reducing the influence of thermal conduction to the semiconductor chip. Note that the effect disclosed herein is not necessarily limited and may be any effect disclosed in the present disclosure.

MODE(S) FOR CARRYING OUT THE INVENTION

Modes for carrying out the present technology (hereinafter referred to as embodiments) will be described below. The description is given in the following order.
1. First embodiment (example of a case of using a via plug)
2. Second embodiment (example of a case of omitting a via plug)
3. Third embodiment (example of a case of using a first connection portion having a spacer)
4. Fourth embodiment (example of a case where an image sensor is arranged in a recess provided in an image sensor substrate)
5. Fifth embodiment (example of an imaging apparatus having a lens module mounted thereon)

1. First Embodiment

[Configuration of Semiconductor Device]

Figure 1:
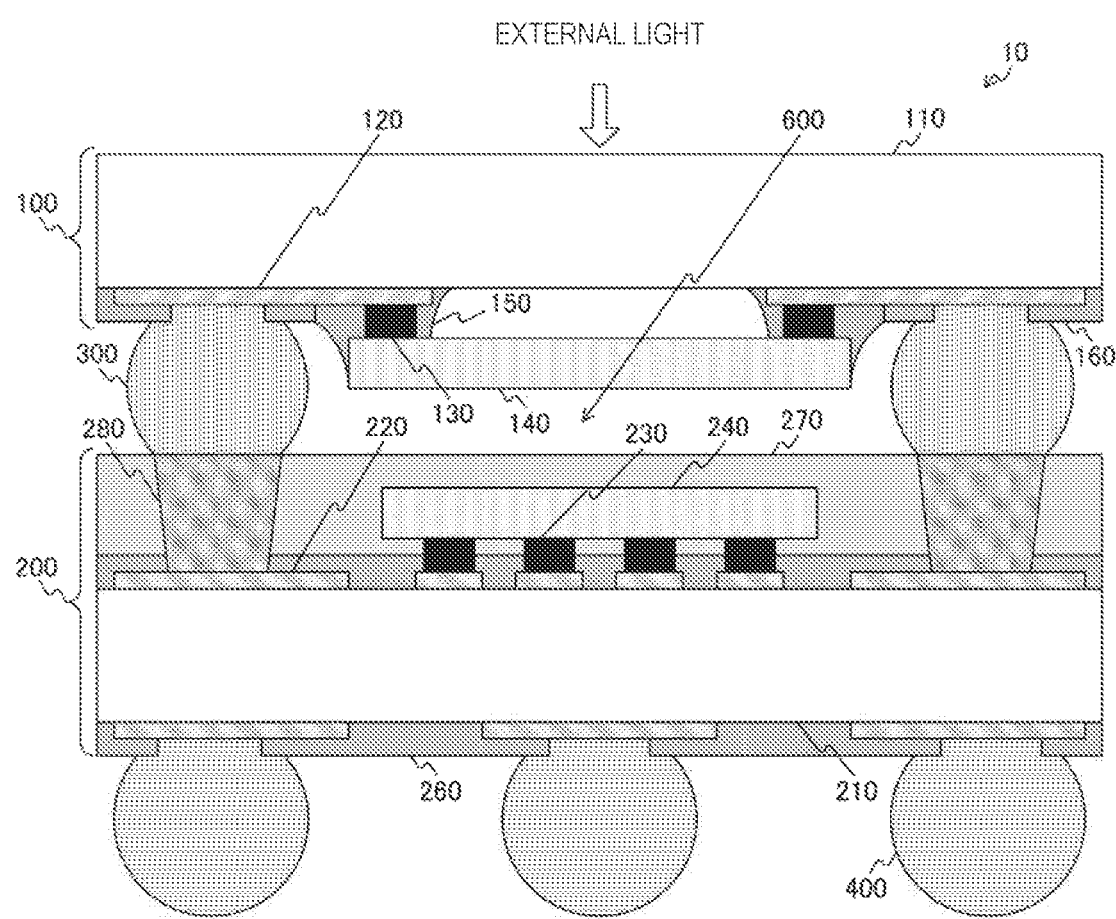
FIG. 1 is a diagram illustrating a configuration example of an imaging apparatus 10 according to a first embodiment of the present technology.

FIG. 1 is a diagram illustrating a configuration example of an imaging apparatus 10 according to a first embodiment of the present technology. This figure is a cross-sectional view illustrating the configuration of an imaging apparatus used for a camera or the like. The imaging apparatus 10 includes an image sensor package 100, an image processing package 200, a first connection portion 300, and a second connection portion 400.

The image sensor package 100 is a package having an image sensor. The image sensor package 100 includes an image sensor substrate 110, a first wiring 120, a bump 130, an image sensor 140, an adhesive 150, and a protective film 160. Moreover, the image sensor package 100 is an example of the first package recited in the claims.

The image sensor 140 is a semiconductor chip in which pixels, each of which has a photoelectric conversion device that converts irradiating light into electric signals, are arranged in a two-dimensional lattice pattern. The image sensor 140 outputs an image signal that is a signal corresponding to the irradiating light. In addition, in this figure, the image sensor 140 is irradiated with light through the image sensor substrate 110. Thus, the image sensor 140 has a light receiving surface on which pixels are arranged. The light receiving surface is arranged to face the image sensor substrate 110. A substrate having transparency is used for the image sensor substrate 110.

The bump 130 electrically connects the image sensor 140 and the first wiring 120. In an example, the bump 130 can include a metal such as copper (Cu) or solder, and can be formed in a columnar shape on the image sensor 140. Specifically, it is possible to use a stud bump including a bump or gold wire in which solder coating is formed on the surface of columnar copper (Cu) and nickel (Ni) formed by plating.

The image sensor substrate 110 is a substrate having the image sensor 140 or the like mounted thereon. This image sensor substrate 110 includes a transparent base material, for example, glass. In addition, the use of glass having the thermal expansion coefficient that is substantially equal to that of the image sensor 140, for example, Pyrex (registered trademark) for the image sensor substrate 110 makes it possible to reduce the stress generated with the change in temperature. Moreover, the image sensor substrate 110 is an example of the first substrate recited in claims.

The first wiring 120 is a wiring that is electrically connected to the image sensor 140 and transfers an electric signal from the image sensor 140. The first wiring 120 in the figure is electrically connected with the image sensor 140 through the bump 130. The first wiring 120 can be configured as a film of metal such as copper (Cu). In addition, the first wiring 120 can include the coating formed in the opening of the protective film 160 described later and intended to improve the solderability and to prevent excessive formation of an alloy layer on the soldering surface. This coating can include, in an example, nickel (Ni) and gold (Au) arranged on top of each other in this order. Moreover, a stress relaxation layer (not shown) can be arranged between the first wiring 120 and the image sensor substrate 110. This is for preventing peeling of the first wiring 120 or occurrence of a crack in the image sensor substrate 110 caused by a difference in thermal expansion coefficients between the first wiring 120 and the image sensor substrate 110.

The adhesive 150 fixes the image sensor 140 to the image sensor substrate 110. This adhesive 150 is arranged on the peripheral portion of the image sensor 140 and fixes the image sensor 140 to reinforce the connection between the image sensor 140 and the first wiring 120 by the bump 130. In addition, the light receiving surface of the image sensor 140 is hermetically sealed together with the image sensor substrate 110. In an example, an epoxy adhesive can be used for the adhesive 150.

The protective film 160 is a film that protects the first wiring 120. In an example, a film including a solder resist can be used for the protective film 160. In addition, in the case where the stress relaxation layer is arranged, the protective film 160 including the same material as the stress relaxation layer is used. This is for preventing peeling of the protective film 160 or the like due to the difference in thermal expansion coefficients between the two. Moreover, the protective film 160 has an opening formed in a portion where the first connection portion 300 described later and the first wiring 120 are connected.

The image processing package 200 is a package having a processing circuit for processing the image signal that is output from the image sensor 140. This image processing package 200 includes an image processing substrate 210, a second wiring 220, a bump 230, an image processing chip 240, a protective film 260, an encapsulant 270, and a via plug 280. Moreover, the image processing package 200 is an example of the second package recited in the claims.

The image processing chip 240 processes the image signal output from the image sensor 140. This image processing chip 240 performs output of a control signal for controlling the image sensor 140 and processing of the image signal output from the image sensor 140. In an example, the processing of the image signal corresponds to analog-to-digital conversion for converting an analog image signal output by the image sensor 140 into a digital image signal. Moreover, the image processing chip 240 is an example of the processing circuit recited in the claims.

The bump 230 electrically connects the image processing chip 240 and the second wiring 220. This bump 230 can have a similar configuration to the bump 130. Moreover, although the image processing package 200 in the figure shows an example in which the image processing chip 240 is flip-chip mounted, the image processing chip 240 can also be mounted by wire bonding. In this case, a bonding wire, instead of the bump 230, is used to connect the image processing chip 240 and the second wiring 220.

The image processing substrate 210 is a substrate on which an electronic circuit such as the image processing chip 240 for driving the image sensor 140 is mounted. This electronic circuit is an electronic circuit including the image processing chip 240 and passive components (not shown) such as resistors and capacitors. In an example, a substrate having a glass-containing epoxy resin can be used for the image processing substrate 210. In this case, it is preferable to use a substrate having the thermal expansion coefficient that is substantially equal to that of the image sensor substrate 110. This is because it is possible to prevent the concentration of stress applied to the first connection portion 300 described later and to improve the reliability of the connection. In addition, glass that is the same base material as the image sensor substrate 110 can be used for the image processing substrate 210. Moreover, although the image processing substrate 210 in this figure has a configuration in which the second wiring 220 is arranged on both sides, this is not limited thereto, and a multilayer board in which an insulating layer and a wiring layer are arranged on top of each other can be used. Moreover, the image processing substrate 210 is an example of the second substrate recited in the claims.

The second wiring 220 is a wiring that is electrically connected to the image processing chip 240 for transferring an electric signal to the image processing chip 240. A wiring including a metal film such as copper (Cu) can be used for the second wiring 220, which is similar to the first wiring 120. In addition, the second wiring 220 is formed on both sides of the image processing substrate 210. Moreover, the second wirings 220 arranged on the front surface and the back surface of the image processing substrate 210 can be connected to each other through a through hole (not shown) or the like.

The protective film 260 is a film for protecting the second wiring 220. A film including a solder resist can be used for the protective film 260, which is similar to the protective film 160. In addition, the protective film 260 is arranged on both sides of the image processing substrate 210. Furthermore, the protective film 260 has an opening formed in a portion where the via plug 280 described later is arranged and a portion where the second connection portion 400 is arranged.

The encapsulant 270 is used to seal electronic components, such as the image processing chip 240, mounted on the image processing substrate 210. In an example, an encapsulant formed by molding an epoxy resin that contains filler material can be used for the encapsulant 270. In addition, the encapsulant 270 has an opening formed in a portion where the via plug 280 described later is arranged.

The via plug 280 is arranged in the opening formed in the encapsulant 270 and is electrically connected to the second wiring 220. The via plug 280 can include, in an example, the solder filled in the opening formed in the encapsulant 270. The via plug 280 in this figure is arranged in the opening formed in the protective film 260 and the encapsulant 270. The via plug 280 is an example of the conductive member recited in the claims.

The first connection portion 300 electrically connects the first wiring 120 and the second wiring 220. The first connection portion 300 in this figure electrically connects the first wiring 120 and the second wiring 220 through the via plugs 280. This first connection portion 300 allows the image sensor package 100 to be fixed to the image processing package 200. In this event, the image sensor 140 and the encapsulant 270 are arranged to face each other in a non-contact manner, and the both are fixed. In an example, spherical-shaped solder can be used for the first connection portion 300. A plurality of the first connection portions 300 are arranged between the image sensor package 100 and the image processing package 200. Moreover, the first connection portion 300 is an example of the connection portion recited in the claims.

The second connection portion 400 is electrically connected to the second wiring 220 and exchanges electric signals with an electric circuit mounted on an external circuit of the imaging apparatus 10, for example, a main board of the camera. The second connection portion 400 is used for outputting an image signal processed by the image processing chip 240 to an external circuit and supplying from an external circuit of the power supply consumed in the imaging apparatus 10. The spherical-shaped solder can be used for the second connection portion 400, which is similar to the first connection portion 300. In addition, the second connection portion 400 is connected to the second wiring 220 at the opening formed in the protective film 260.

The image signal output by the image sensor 140 is input to the image processing chip 240, through the bump 130, the first wiring 120, the first connection portion 300, the via plug 280, the second wiring 220, and the bump 230 in this order. In addition, the image signal processed by the image processing chip 240 is output to the outside of the imaging apparatus 10, through the bump 230, the second wiring 220, and the second connection portion 400 in this order.

With the recent increase in resolution such as 4K image or the like, the number of pixels of the image sensor 140 increases, and so it is necessary to shorten the processing time in the image processing chip 240. Thus, the use of the image processing chip 240 that operates at high speed allows improvement of the throughput of the image signal per unit time in the imaging apparatus 10 to be achieved. Such an image processing chip 240 has high power consumption and large temperature rise. On the other hand, the photoelectric conversion device of the image sensor 140 has such a property that the performance is deteriorated, for example, the signal-to-noise ratio (S/N ratio) is reduced in a high temperature environment. The thermal conduction is necessary to be reduced to prevent degradation of the performance of the image sensor 140 due to the influence of heat generated in the image processing chip 240. Thus, in the imaging apparatus 10 in this figure, the image sensor 140 and the encapsulant 270 are arranged in a non-contact manner, and so a gap 600 is defined between the image sensor 140 and the encapsulant 270. This allows the thermal conduction path only to the first connection portion 300, thereby preventing the thermal conduction between the image sensor 140 and the image processing chip 240. In addition, the convection occurring in the gap 600 enables the image sensor 140 to be cooled, and so it is possible to reduce an increase in the temperature of the image sensor 140. In addition, the use of a glass substrate having low thermal conductivity for the image sensor substrate 110 enables the heat transferred to the image sensor 140 to be to further reduced. This makes it possible to prevent deterioration of the performance of the image sensor 140 due to the influence of heat generated in the image processing chip 240.

Further, the signal is transferred through the first connection portion 300 arranged in the vicinity of the position where the image sensor 140 and the image processing chip 240 face each other, so the size of the imaging apparatus 10 can be reduced. In an example, assuming that the thickness of the image sensor 140 and the height of the bump 130 are 0.12 mm and 0.03 mm, respectively, the total of these is 0.15 mm. On the other hand, the arrangement of the first connection portion 300 having a diameter of 0.2 mm allows a space between the image sensor 140 and the encapsulant 270 to be approximately 0.05 mm. In this case, the arrangement pitch of the first connection portion 300 can be set to 0.4 mm. Furthermore, as illustrated in this figure, the first connection portion 300 is arranged in the vicinity of the image sensor 140 and the image processing chip 240 in such a manner that it may be adjacent to the image sensor 140 and the image processing chip 240. This makes it possible to reduce the size of the imaging apparatus 10, as compared with a case where the image sensor 140 and the image processing chip 240 are arranged on a plane and mounted in one package. In addition, it is possible to shorten the signal transfer path between the image sensor 140 and the image processing chip 240, thereby transferring a high frequency signal. Thus, it is possible to improve the processing speed of the image processing chip.

Further, in the imaging apparatus 10 in this figure, electrical and optical tests can be performed on the image sensor package 100 and the image processing package 200 before connecting these packages with each other using the first connection portion 300. This makes it possible to improve the yield of the imaging apparatus 10.

The image sensor 140 and the image processing chip 240 can be manufactured by different processes, so it is possible to select an optimum process for the respective semiconductor chips. In an example, the image processing chip 240 includes a digital circuit as a main component, which necessitates a large circuit scale and high speed operation. Thus, a miniaturized complementary metal-oxide-semiconductor (CMOS) technology is applied and it is manufactured. On the other hand, the image sensor 140 includes an analog circuit for amplifying and outputting photoelectrically converted electrical signals as a main component, so there is not necessary for high-speed CMOS technology unlike the image processing chip 240, and it can be manufactured by low cost technology. In this manner, the image sensor 140 and the image processing chip 240 can be manufactured by their respective optimal processes. Thus, the overall manufacturing cost can be reduced while maintaining the necessary performance as compared with the case where both are formed on one semiconductor chip.

Moreover, it is preferable to use solder materials having different soldering temperatures for the first connection portion 300 and the second connection portion 400. Specifically, in the manufacturing process of the imaging apparatus 10, one of the first connection portion 300 and the second connection portion 400, which is first soldered in the soldering order, uses solder having a higher soldering temperature than that of the other. In the manufacturing process of the imaging apparatus 10 described later, the first connection portion 300 is soldered before the second connection portion 400, and so it is possible to use solder having a relatively high soldering temperature such as tin (Sn)-silver (Ag)-copper(Cu) solder for the first connection portion 300. In addition, it is possible to use solder having a relatively low soldering temperature such as tin (Sn)-zinc (Zn)-bismuth (Bi) solder for the second connection portion 400. This makes it possible to prevent the remelting of the first connection portion 300 when the second connection portion 400 is soldered, thereby preventing the occurrence of troubles such as positional deviation of the image sensor package 100.

[Manufacturing Method of Semiconductor Device]

Figure 2A:
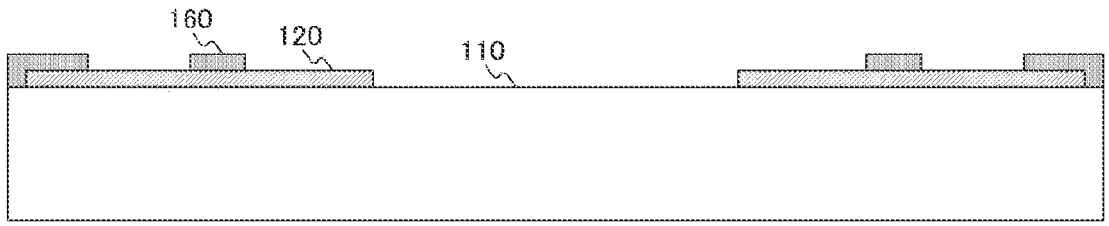
FIGS. 2A, 2B, 2C, and 2D are diagrams illustrating an example of a manufacturing process of an image sensor package 100 according to the first embodiment of the present technology.
Figure 2B:
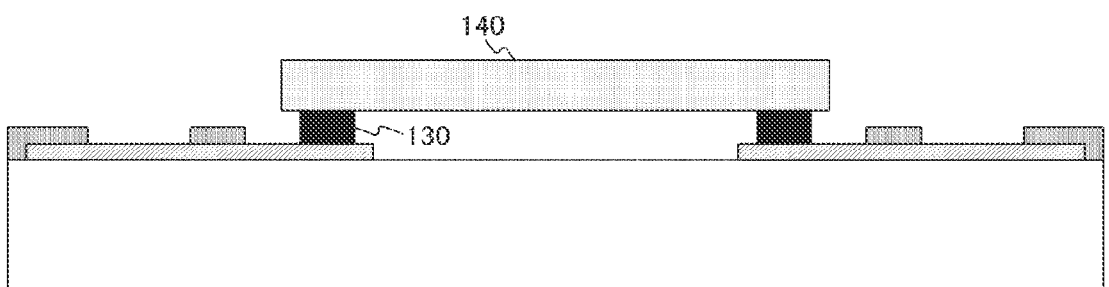
Figure 2C:
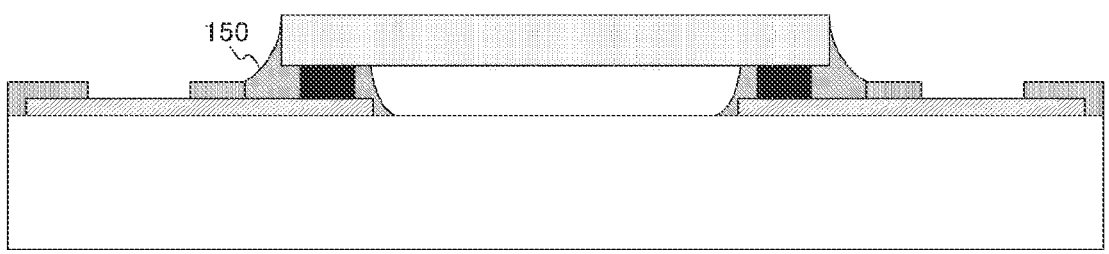
Figure 2D:
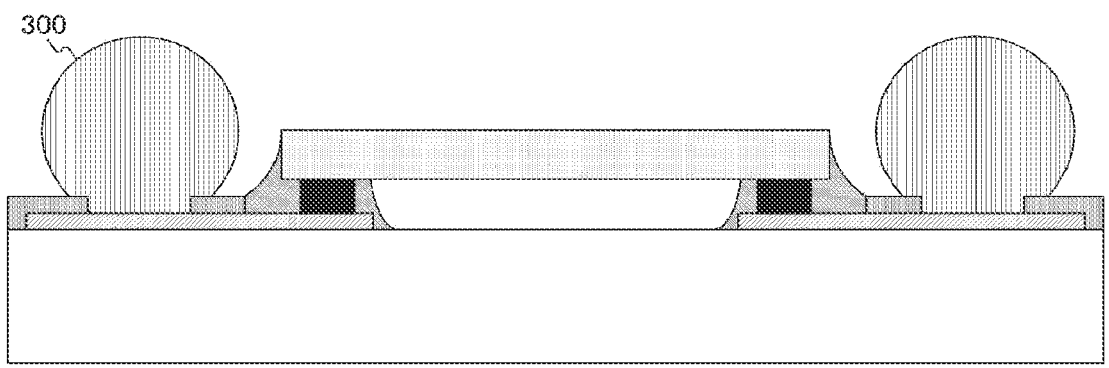

FIGS. 2A, 2B, 2C, and 2D are diagrams illustrating an example of a manufacturing process of the image sensor package 100 according to the first embodiment of the present technology. The first wiring 120 and the protective film 160 are first sequentially formed on the image sensor substrate 110 (FIG. 2A). The image sensor 140 is then mounted (FIG. 2B). This can be carried out by mounting the image sensor 140 on the first wiring 120 while aligning it, placing it in a reflow furnace, and soldering it. Then, an adhesive 150 is applied to the peripheral portion of the image sensor 140 and cured (FIG. 2C). This makes it possible to manufacture the image sensor package 100. Then, the first connection portion 300 is arranged in the opening of the protective film 160, and soldering is performed on it (FIG. 2D).

Figure 3A:
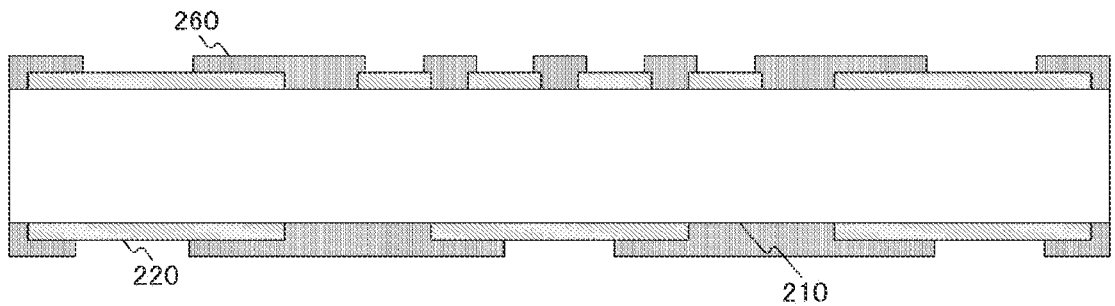
FIGS. 3A, 3B, and 3C are diagrams illustrating an example of manufacturing process of an image processing package 200 according to the first embodiment of the present technology.
Figure 3B:
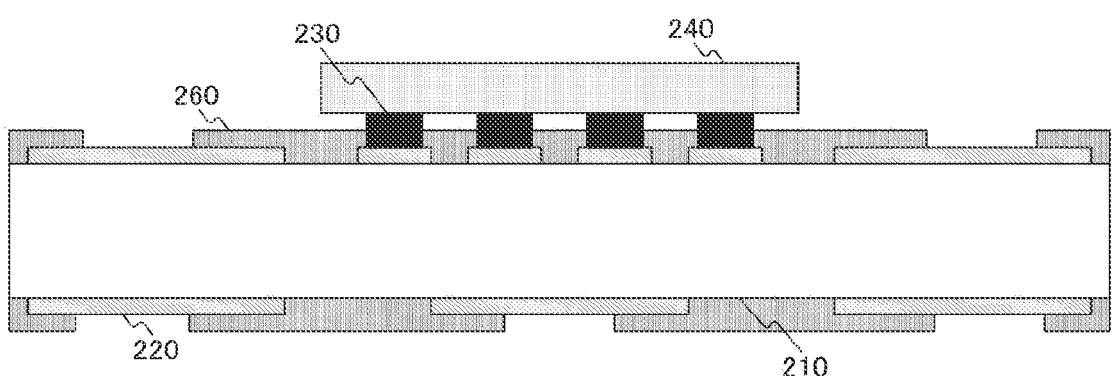
Figure 3C:
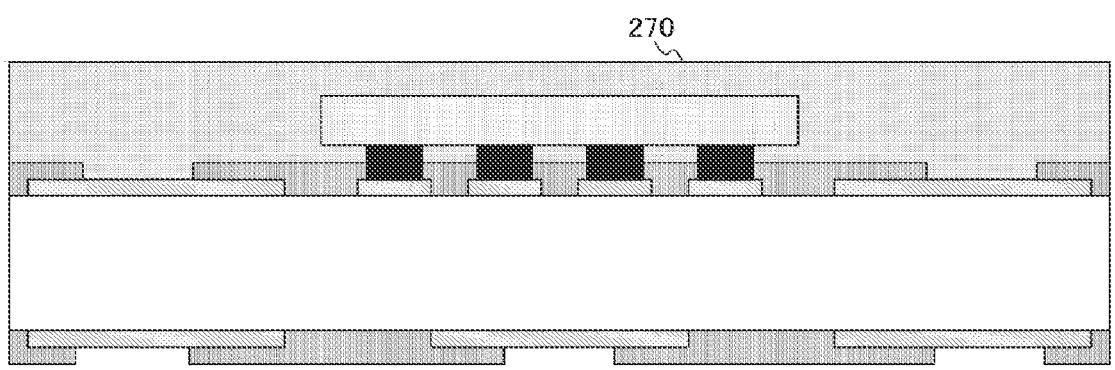

FIGS. 3A, 3B, and 3C are diagrams illustrating an example of a manufacturing process of the image processing package 200 according to the first embodiment of the present technology. The second wiring 220 and the protective film 260 are first sequentially formed on the image processing substrate 210 (FIG. 3A). Then, the image processing chip 240 is mounted (FIG. 3B). This can be carried out in a similar manner to the mounting of the image sensor 140. Then, the encapsulant 270 is formed by molding (FIG. 3C).

Figure 4A:
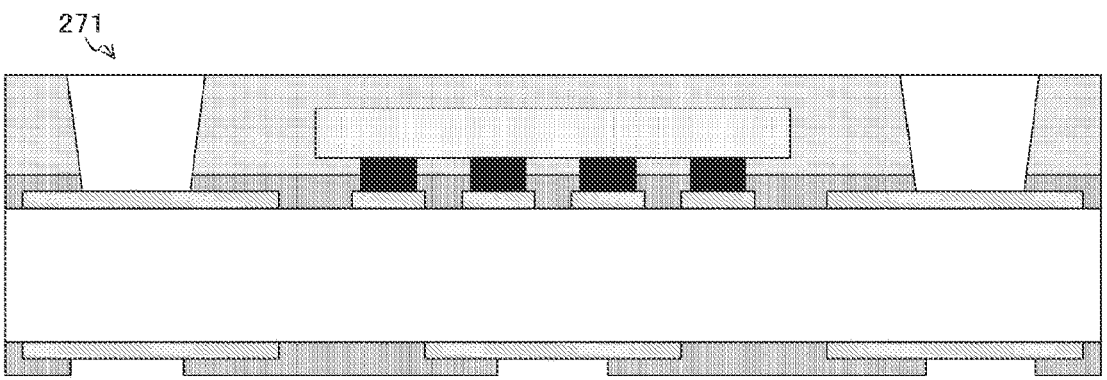
FIGS. 4A and 4B are diagrams illustrating an example of manufacturing process of an image processing package 200 according to the first embodiment of the present technology.
Figure 4B:
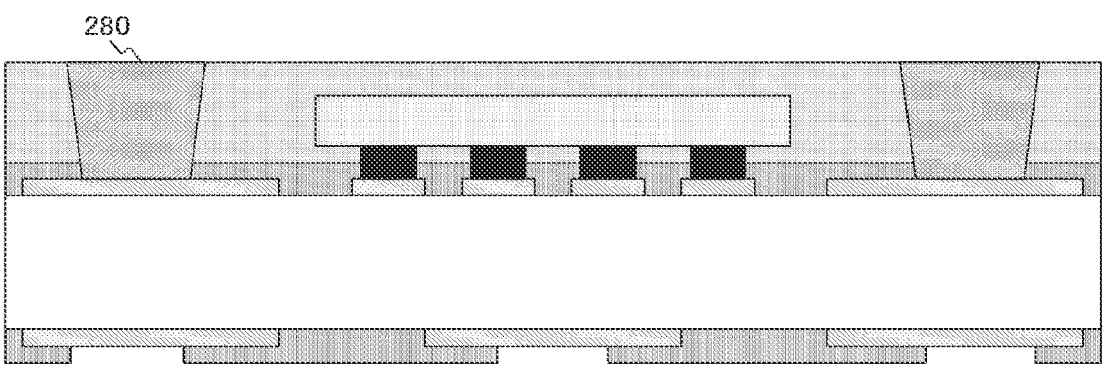

FIGS. 4A and 4B are diagrams illustrating an example of a manufacturing process of the image processing package 200 according to the first embodiment of the present technology. In the image processing package 200 on which the encapsulant 270 is formed, an opening 271 is formed in the encapsulant 270 (FIG. 4A). This can be carried out, in an example, by irradiating the encapsulant 270 with light produced from the carbon dioxide laser to cause ablation and by removing the encapsulant 270 in the irradiated portion. Then, the via plug 280 is arranged in the opening 271 (FIG. 4B). This can be formed, in an example, by arranging spherical-shaped solder and a flux in the opening 271 and by melting this solder in a reflow furnace. This makes it possible to manufacture the image processing package 200.

Figure 5A:
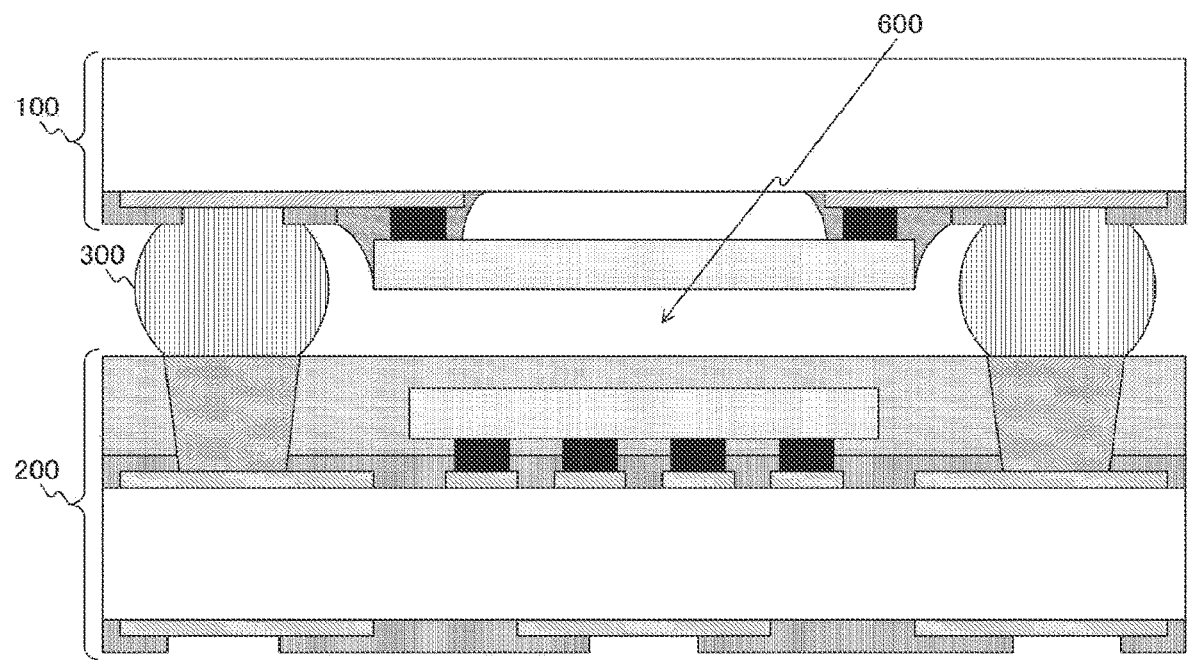
FIGS. 5A and 5B are diagrams illustrating an example of a manufacturing process of the imaging apparatus 10 according to the first embodiment of the present technology.
Figure 5B:
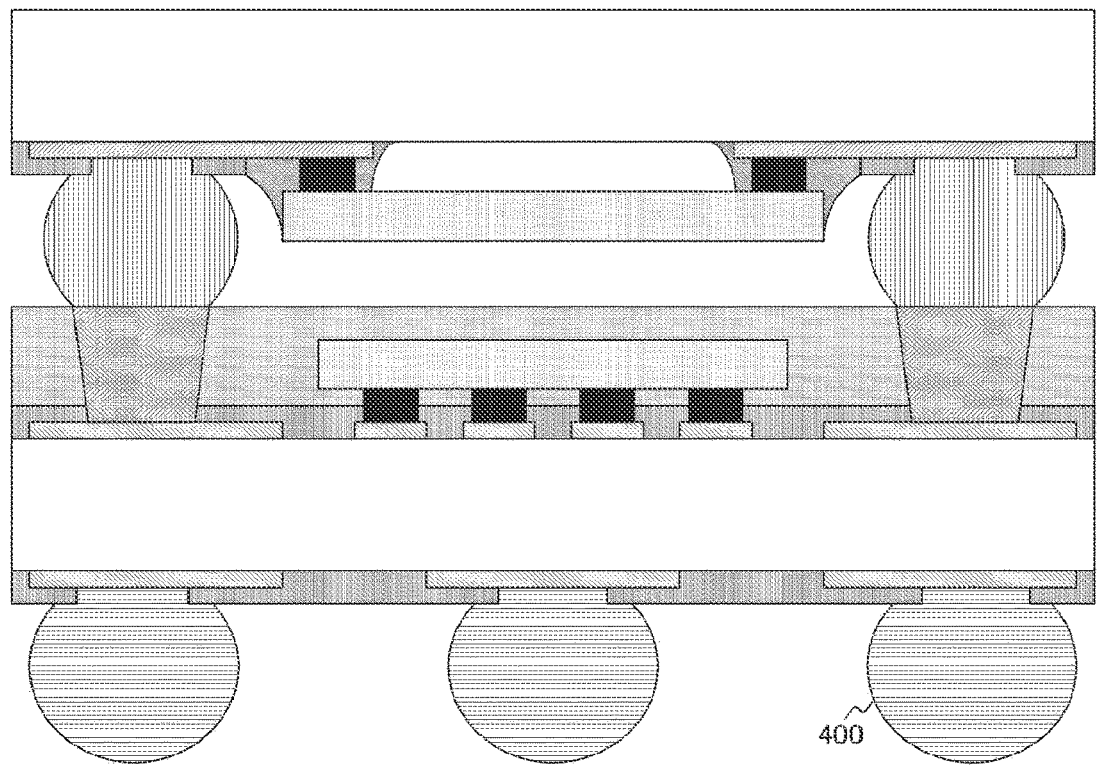

FIGS. 5A and 5B are diagrams illustrating an example of a manufacturing process of the imaging apparatus 10 according to the first embodiment of the present technology. The image sensor package 100 on which the first connection portion 300 is arranged is first placed on the image processing package 200. In this event, the via plug 280 of the image processing package 200 and the first connection portion 300 are aligned and arranged. This allows the image sensor 140 of the image sensor package 100 and the image processing chip 240 of the image processing package 200 to be arranged to face each other. In this event, the image sensor 140 and the encapsulant 270 are held in a non-contact state. Then, the first connection portion 300 and the second wiring 220 are soldered to each other in a reflow furnace (FIG. 5A). Then, the second connection portion 400 is arranged in the opening of the protective film 260 of the image processing package 200 (FIG. 5B). This can be carried out by soldering. The imaging apparatus 10 can be manufactured using the above processes.

Moreover, the manufacturing process of the imaging apparatus 10 is not limited to the example described above. In an example, the image processing package 200 is arranged on the main board of a camera or the like through the second connection portion 400. Then, a manufacturing process in which the image sensor package 100 is arranged in the image processing package 200 through the first connection portion 300 can be used. In this case, it is possible to use solder having a relatively low soldering temperature for the first connection portion 300 and to use solder having a relatively high soldering temperature for the second connection portion 400. In addition, although the embodiment of the present technology is described taking the imaging apparatus 10 as an example, the present technology is applicable to other semiconductor devices.

As described above, in the first embodiment of the present technology, the image sensor 140 and the image processing chip 240 are arranged to face each other while being adjacent to each other, and the image sensor 140 and the encapsulant 270 around the image processing chip 240 are arranged in a non-contact manner. This makes it possible to reduce the size of the imaging apparatus 10 while reducing the influence of thermal conduction to the image sensor 140.

2. Second Embodiment

In the embodiment described above, the first wiring 120 and the second wiring 220 are electrically connected through the via plug 280 formed in the encapsulant 270. On the other hand, in a second embodiment of the present technology, the first connection portion 300 directly connects the first wiring 120 and the second wiring 220. This can make it unnecessary to use the via plug 280, thereby simplifying the configuration of the imaging apparatus 10.

[Configuration of Semiconductor Device]

Figure 6:
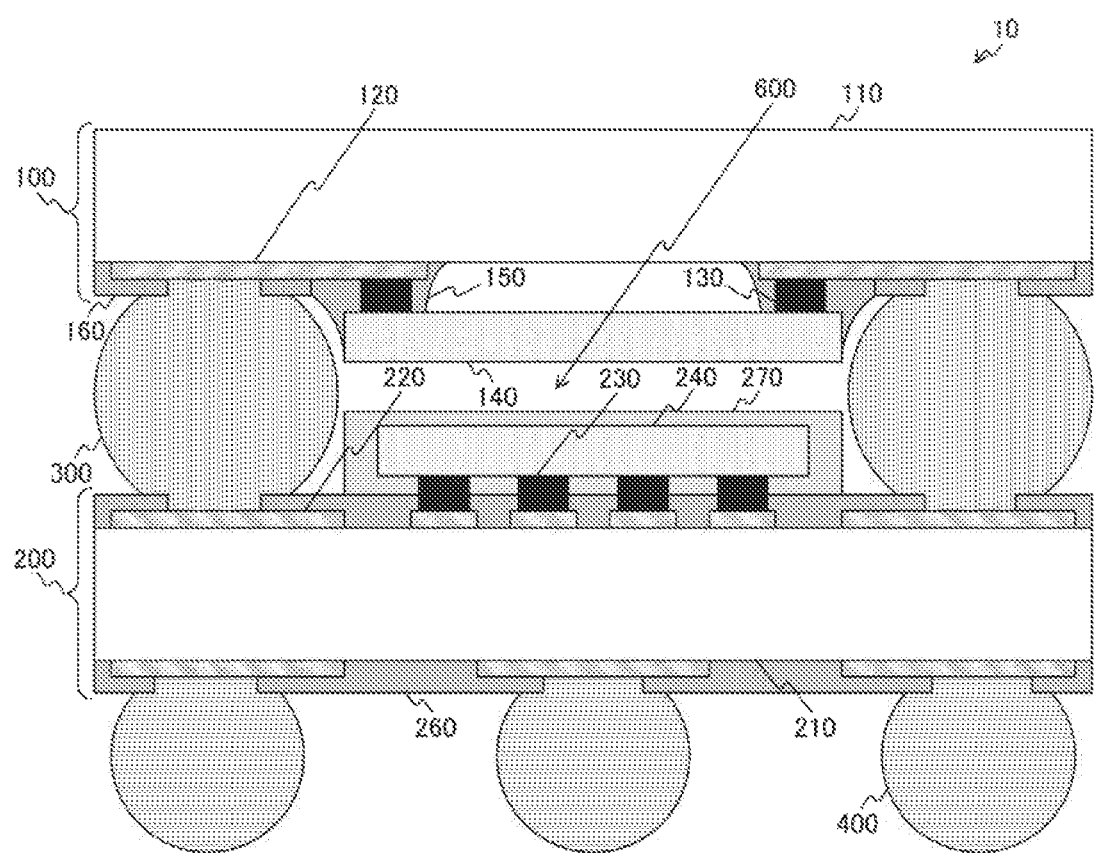
FIG. 6 is a diagram illustrating a configuration example of an imaging apparatus 10 according to a second embodiment of the present technology.

FIG. 6 is a diagram illustrating a configuration example of an imaging apparatus 10 according to the second embodiment of the present technology. The imaging apparatus 10 in this figure is different from the imaging apparatus 10 described with reference to FIG. 1 in the following points. First, the encapsulant 270 is arranged only in the peripheral portion of the image processing chip 240, and the first connection portion 300 directly connects the first wiring 120 and the second wiring 220 without through the via plug 280. Thus, the imaging apparatus 10 in this figure may not necessary to have the via plug 280.

The other configuration of the imaging apparatus 10 than the configuration described above is similar to that of the imaging apparatus 10 described with reference to FIG. 1, so a description thereof will be omitted.

As described above, according to the second embodiment of the present technology, the direct connection between the first wiring 120 and the second wiring 220 through the first connection portion 300 enables the via plug 280 to be omitted, thereby simplifying the imaging apparatus 10.

3. Third Embodiment

In the second embodiment described above, the first connection portion 300 including solder is used. On the other hand, in a third embodiment of the present technology, the connection is performed using the first connection portion 300 having a spacer. This allows the space between the first substrate 110 and the second substrate 210 to be defined, and thereby preventing the contact between the image sensor 140 and the encapsulant 270.

[Configuration of Semiconductor Device]

Figure 7:
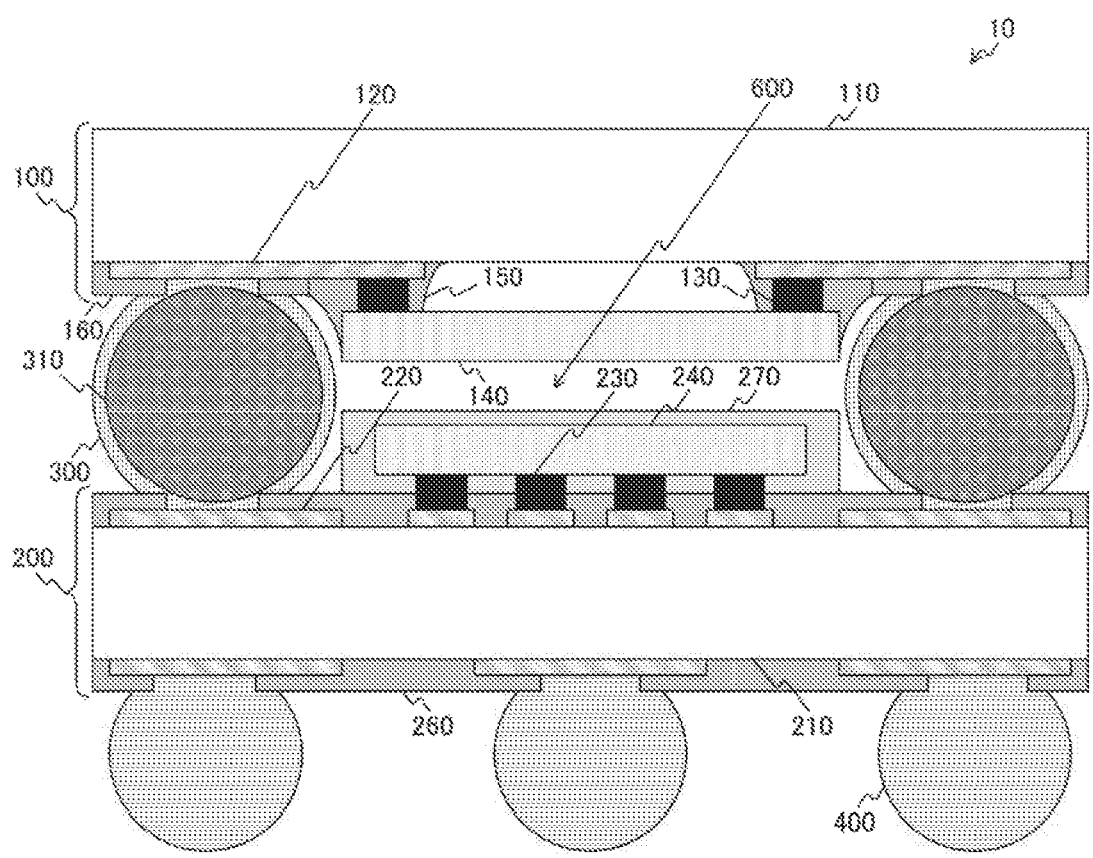
FIG. 7 is a diagram illustrating a configuration example of an imaging apparatus 10 according to a third embodiment of the present technology.

FIG. 7 is a diagram illustrating a configuration example of the imaging apparatus 10 according to the third embodiment of the present technology. The imaging apparatus 10 in this figure is different from the imaging apparatus 10 described with reference to FIG. 6 in that a spacer 310 is provided inside the first connection portion 300.

The spacer 310 defines the space between the first substrate 110 and the second substrate 210. A spherical epoxy resin can be used for the spacer 310. As described above, the first connection portion 300 according to the third embodiment of the present technology includes solder having the spacer 310 therein.

The use of the spacer 310 allows the space between the first substrate 110 and the second substrate 210 to be defined. This makes it possible to prevent the image sensor 140 and the encapsulant 270 from coming into contact with each other when soldering using the first connection portion 300 is performed. In addition, it is possible to improve the accuracy of the inclination of the image sensor substrate 110 with respect to the image processing substrate 210.

The other configuration of the imaging apparatus 10 than the configuration described above is similar to that of the imaging apparatus 10 described with reference to FIG. 6, so a description thereof will be omitted.

As described above, according to the third embodiment of the present technology, the space between the first substrate 110 and the second substrate 210 is defined by the spacer 310, so it is possible to prevent the image sensor 140 and the encapsulant 270 from coming into contact with each other at the time of soldering.

4. Fourth Embodiment

In the first embodiment described above, the flat-plate image sensor substrate 110 is used. On the other hand, in a fourth embodiment of the present technology, the image sensor substrate 110 having a recess is used, and the image sensor 140 is arranged in the recess. This makes it possible to widen the space between the image sensor 140 and the encapsulant 270, thereby reducing the temperature rise of the image sensor 140.

Figure 8:
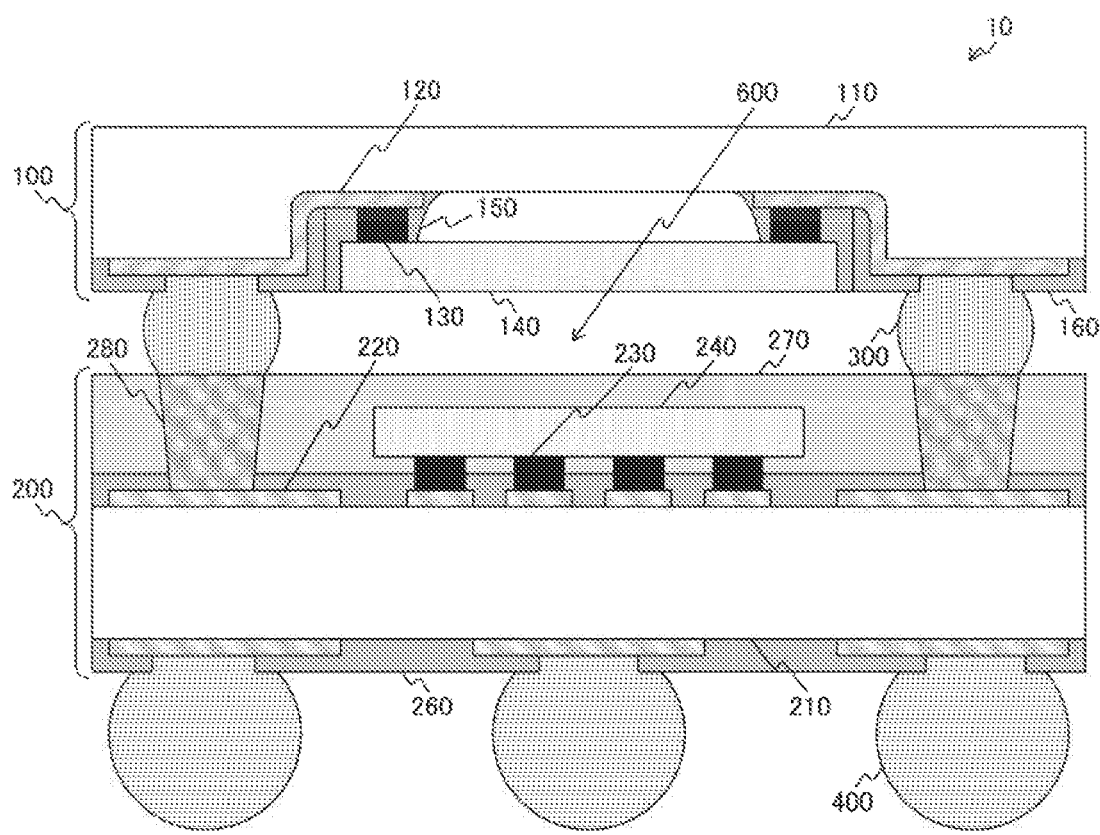
FIG. 8 is a diagram illustrating a configuration example of an imaging apparatus 10 according to a fourth embodiment of the present technology.

[Configuration of Semiconductor Device] FIG. 8 is a diagram illustrating a configuration example of an imaging apparatus 10 according to the fourth embodiment of the present technology. The imaging apparatus 10 in this figure is different from the imaging apparatus 10 described with reference to FIG. 1 in that an image sensor substrate 110 having a recess is used and the image sensor 140 is arranged in the recess.

As illustrated in this figure, in the image sensor package 100 according to the fourth embodiment of the present technology, the first wiring 120 is extended in the recess provided in the image sensor substrate 110 and the image sensor 140 is embedded and mounted in the recess. This makes it possible to widen the space between the image sensor 140 and the encapsulant 270, thereby further reducing the temperature rise of the image sensor 140. In addition, in the case of setting the same space as the imaging apparatus 10 described in FIG. 1, it is possible to further reduce the size of the first connection portion 300 and arrange it at a narrow pitch. This makes it possible to reduce the size of the image sensor package 100.

The other configuration of the imaging apparatus 10 than the configuration described above is similar to that of the imaging apparatus 10 described in FIG. 1, so a description thereof will be omitted.

As described above, according to the fourth embodiment of the present technology, it is possible to widen the space between the image sensor 140 and the encapsulant 270, thereby reducing the temperature rise of the image sensor 140.

5. Fifth Embodiment

The embodiment described above is based on the assumption that the imaging apparatus includes the image sensor package 100 and the image processing package 200. On the other hand, a fifth embodiment of the present technology is based on the assumption that the imaging apparatus in which a lens module is arranged is used. This makes it possible to reduce the size of the imaging apparatus 10 while reducing the influence of thermal conduction to the image sensor 140 in the imaging apparatus having the lens module arranged therein.

Figure 9:
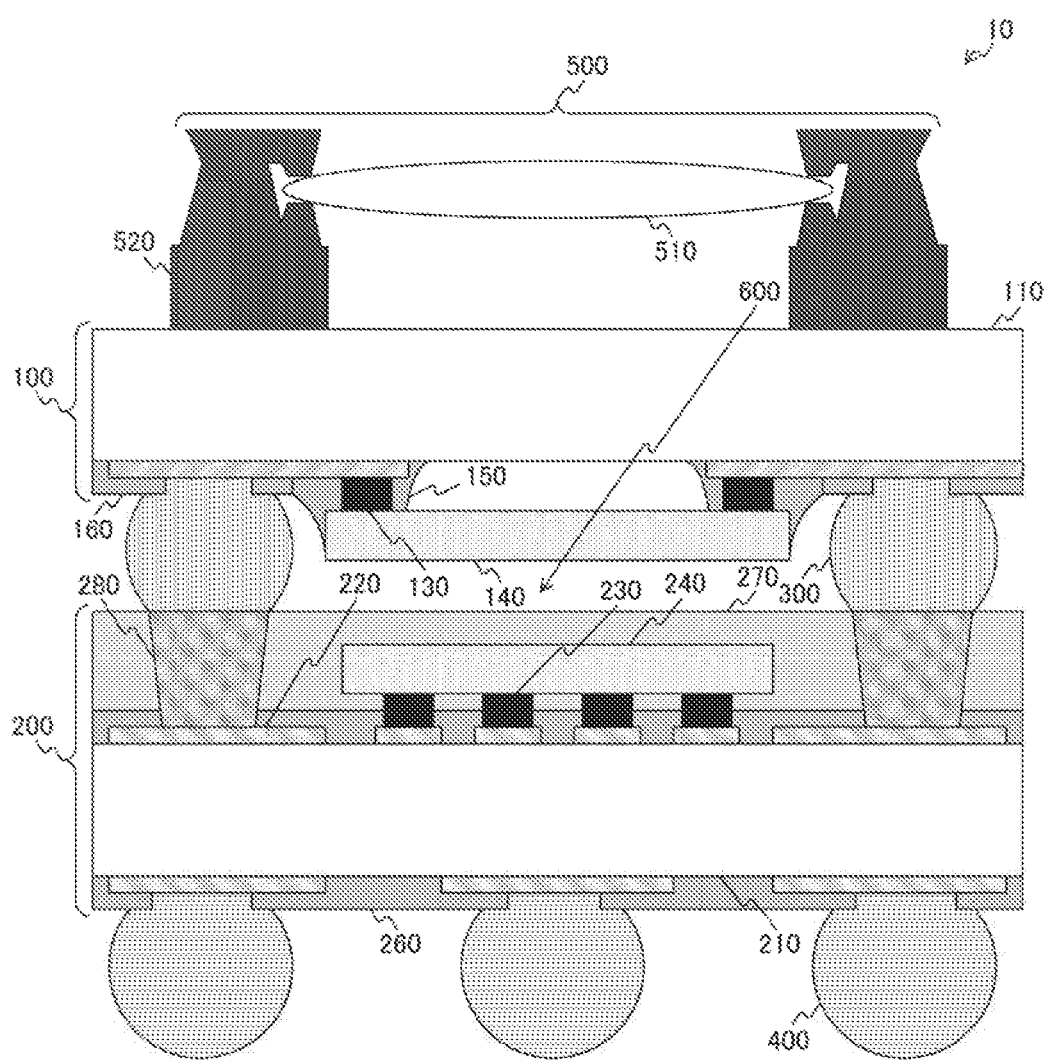
FIG. 9 is a diagram illustrating a configuration example of an imaging apparatus 10 according to a fifth embodiment of the present technology.

[Configuration of Imaging Apparatus] FIG. 9 is a diagram illustrating a configuration example of the imaging apparatus 10 according to the fifth embodiment of the present technology. This imaging apparatus 10 is different from the imaging apparatus 10 described in FIG. 1 in that it further includes a lens module 500.

The lens module 500 forms an optical image on the image sensor 140. The lens module 500 includes a lens 510 and a lens holding portion 520.

The lens 510 converges light. The lens holding portion 520 holds the lens 510. Moreover, a lens driving mechanism that adjusts the focal position by changing the position of the lens 510 may be arranged in the lens holding portion 520.

The lens module 500 is arranged on the image sensor substrate 110. When the lens module 500 is arranged on the image sensor substrate 110 in this manner, deflection occurs in the image sensor substrate 110 and the image sensor 140 is deformed, which may have an influence on the performance of the image sensor 140 in some cases. However, the use of the image sensor substrate 110 including glass makes it possible to reduce the deflection of the image sensor substrate 110, thereby reducing the influence on the image sensor 140. This is because the glass is a base material having high rigidity and so it is difficult for deflection to occur. In addition, the arrangement of an infrared light cut filter on the image sensor substrate 110 including glass makes it possible to eliminate the arrangement of the infrared light cut filter on the lens module 500, thereby reducing the cost of the lens module 500.

The other configuration of the imaging apparatus 10 than the configuration described above is similar to that of the imaging apparatus 10 described in FIG. 1, so a description thereof will be omitted.

As described above, according to the fifth embodiment of the present technology, in the imaging apparatus 10 including the lens module 500, it is possible to reduce the size of the imaging apparatus 10 while reducing the influence of thermal conduction to the image sensor 140.

As described above, according to the embodiments of the present technology, the image sensor 140 and the encapsulant 270 around the image processing chip 240 are arranged in a non-contact manner, so it is possible to reduce the influence of thermal conduction to the image sensor 140 while reducing the size of the imaging apparatus 10. This makes is possible to prevent the deterioration of the performance of the image sensor 140.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a hard disk, a CD (Compact Disc), an MD (Mini- Disc), and a DVD (Digital Versatile Disk), a memory card, and a Blu-ray disc (registered trademark) can be used.

In addition, the effects described in the present specification are not limiting but are merely examples, and there may be other effects.

Additionally, the present technology may also be configured as below.

(1)

A semiconductor device including:

a first package provided with a first substrate under which a semiconductor chip configured to output a signal and a first wiring electrically connected to the semiconductor chip are arranged;

a second package provided with a second substrate above which a processing circuit configured to process the output signal, a second wiring electrically connected to the processing circuit, and an encapsulant configured to seal the processing circuit are arranged, the semiconductor chip and the encapsulant being arranged to face each other in a non-contact manner; and a connection portion configured to electrically connect the first wiring and the second wiring.

(2)

The semiconductor device according to (1), in which the connection portion includes solder.

(3)

The semiconductor device according to (2), in which the connection portion is provided with a spacer used to define a space between the first substrate and the second substrate.

(4)

The semiconductor device according to (2) or (3), further including:

a second connection portion electrically connected to the second wiring, the second connection portion including second solder soldered at a temperature different from that of the solder.

(5)

The semiconductor device according to (1), in which the second package is provided with the second substrate above which a conductive member is further arranged in an opening formed in the encapsulant, the conductive member being electrically connected to the second wiring, and the connection portion electrically connects the first wiring and the second wiring through the conductive member.

(6)

An imaging apparatus including:

a first package provided with a first substrate under which an image sensor configured to output a signal corresponding to irradiating light and a first wiring electrically connected to the image sensor are arranged;

a second package provided with a second substrate above which a processing circuit configured to process the output signal, a second wiring electrically connected to the processing circuit, and an encapsulant configured to seal the processing circuit are arranged, the image sensor and the encapsulant being arranged to face each other in a non-contact manner; and a connection portion configured to electrically connect the first wiring and the second wiring.

(7)

The imaging apparatus according to (6), in which the first package is provided with the first substrate including glass.

(8)

The imaging apparatus according to (7), in which the first package is provided with the first substrate under which the image sensor is arranged, the image sensor outputting the signal corresponding to the irradiating light transmitting through the first substrate.

(9)

The imaging apparatus according to (8), further including:

a lens module configured to form an optical image on the image sensor through the first substrate.

REFERENCE SIGNS LIST 10 imaging apparatus
100 image sensor package
110 image sensor substrate
120 first wiring
130, 230 bump
140 image sensor
150 adhesive
160, 260 protective film
200 image processing package
210 image processing substrate
220 second wiring
240 image processing chip
270 encapsulant
271 opening
280 via plug
300 first connection portion
310 spacer
400 second connection portion
500 lens module
510 lens
520 lens holding portion
600 gap

What is claimed is:

1. A semiconductor device, comprising:
a first package that includes:
a first substrate;
a first semiconductor chip configured to output a signal, wherein the first semiconductor chip is below the first substrate;
a first wiring electrically connected to the first semiconductor chip through a metal bump, wherein the first wiring is below the first substrate; and
a first protective film that includes a first opening portion;
a second package that includes:
a second substrate;
a second semiconductor chip configured to process the signal output from the first semiconductor chip, wherein the second semiconductor chip is above the second substrate;
a second wiring electrically connected to the second semiconductor chip, wherein the second wiring is on each of a front surface of the second substrate and a back surface of the second substrate;
an encapsulant configured to seal the second semiconductor chip and a conductive member in an opening in the encapsulant, wherein the first semiconductor chip faces the encapsulant in a non-contact manner and a gap is defined between the first semiconductor chip and the encapsulant to be 0.05 mm; and
a second protective film that includes a second opening portion, wherein the second protective film is on each of the front surface of the second substrate and the back surface of the second substrate;
a first connection portion configured to electrically connect the first wiring and the second wiring; and a second connection portion electrically connected to the second wiring, wherein
the first protective film is in contact with each of the first connection portion, the first wiring, and the first substrate,
the first connection portion is in contact with the first wiring via the first opening portion, and
the second connection portion is in contact with the second wiring via the second opening portion.

2. The semiconductor device according to claim 1, wherein the first connection portion includes a first solder.

3. The semiconductor device according to claim 2, wherein the second connection portion includes a second solder soldered at a temperature different from that of the first solder.

4. The semiconductor device according to claim 1, wherein
the conductive member is above the second substrate,
the conductive member is electrically connected to the second wiring, and
the first connection portion is further configured to electrically connect the first wiring and the second wiring through the conductive member.

5. The semiconductor device according to claim 1, wherein the first connection portion comprises a spacer configured to define a space between the first substrate and the second substrate.

6. An imaging apparatus, comprising:
a first package that includes:
a first substrate;
a first semiconductor chip configured to output a signal corresponding to irradiating light, wherein
the first semiconductor chip is below the first substrate;
a first wiring electrically connected to the first semiconductor chip through a metal bump, wherein the first wiring is below the first substrate; and
a first protective film that includes a first opening portion;
a second package that includes:
a second substrate;
a second semiconductor chip configured to process the signal output from the first semiconductor chip, wherein the second semiconductor chip is above the second substrate;
a second wiring electrically connected to the second semiconductor chip, wherein the second wiring is on each of a front surface of the second substrate and a back surface of the second substrate;
an encapsulant configured to seal the second semiconductor chip and a conductive member in an opening in the encapsulant, wherein the first semiconductor chip faces the encapsulant in a non-contact manner and a gap is defined between the first semiconductor chip and the encapsulant to be 0.05 mm; and
a second protective film that includes a second opening portion, wherein the second protective film is on each of the front surface of the second substrate and the back surface of the second substrate;
a first connection portion configured to electrically connect the first wiring and the second wiring; and
a second connection portion electrically connected to the second wiring, wherein
the first protective film is in contact with each of the first connection portion, the first wiring, and the first substrate,
the first connection portion is in contact with the first wiring via the first opening portion, and
the second connection portion is in contact with the second wiring via the second opening portion.

7. The imaging apparatus according to claim 6, wherein the first substrate includes glass.

8. The imaging apparatus according to claim 6, wherein the irradiating light is transmittable through the first substrate.

9. The imaging apparatus according to claim 6, further comprising a lens module configured to form an optical image on the first semiconductor chip through the first substrate.

* * * * *